(12) United States Patent
Oh

(10) Patent No.: US 6,411,660 B1
(45) Date of Patent: Jun. 25, 2002

(54) DEVICE FOR REDUCING LOCK-UP TIME OF FREQUENCY SYNTHESIZER

(75) Inventor: Tae-won Oh, Kyongg-do (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/080,518

(22) Filed: May 18, 1998

(30) Foreign Application Priority Data

May 16, 1997 (KR) .............................. 97/18906

(51) Int. Cl.$^7$ .............................. H03D 3/18; H03D 3/24; H03D 3/02
(52) U.S. Cl. .................. 375/327; 375/376; 329/325
(58) Field of Search .............................. 375/327, 328, 375/376, 373, 374, 375; 329/325; 327/147

(56) References Cited

U.S. PATENT DOCUMENTS

| | | | | |
|---|---|---|---|---|
| 5,561,398 A | * | 10/1996 | Rasmussen | 331/36 C |
| 5,625,325 A | * | 4/1997 | Rotzoll et al. | 331/16 |
| 5,657,359 A | * | 8/1997 | Sakae et al. | 375/376 |
| 5,758,266 A | * | 5/1998 | Kornfeld et al. | 455/86 |
| 5,822,366 A | * | 10/1998 | Rapeli | 375/219 |
| 6,028,850 A | * | 2/2000 | Kang | 370/320 |
| 6,226,537 B1 | * | 5/2001 | Namura et al. | 455/574 |

* cited by examiner

Primary Examiner—Chi Pham
Assistant Examiner—Khai Tran
(74) Attorney, Agent, or Firm—Dilworth & Barrese, LLP

(57) ABSTRACT

A device for reducing a lock-up time in a digital cordless telephone. The telephone includes a first frequency synthesizer for generating a reference frequency, a receiver having a first mixer for mixing the reference frequency with an input frequency to generate a first intermediate frequency and a second mixer to generate a second intermediate frequency, and a transmitter having a third mixer to generate a transmission frequency. The device includes: a band switching controller for receiving an inverse channel selection signal; and a second frequency synthesizer for generating third and fourth intermediate frequencies to the second and third mixers, respectively, according to a channel selection signal for setting transmission and reception modes. The second frequency synthesizer includes: a voltage controlled oscillator for generating a frequency according to a charge pump voltage applied at an input of the oscillator; a loop filter for shaping the charge pump voltage being applied to the input of the voltage controlled oscillator; and a phase locked loop for comparing the reference frequency with a frequency output from the voltage controlled oscillator to generate a voltage according to a phase difference therebetween to the input of the voltage controlled oscillator via the loop filter. The band switching controller maintains an input voltage of the voltage controlled oscillator upon receiving the inverse channel selection signal.

20 Claims, 8 Drawing Sheets

DEVICE FOR REDUCING LOCK-UP TIME OF FREQUENCY SYNTHESIZER

BACKGROUND OF THE INVENTION

1. Field of the Invention

The present invention relates to frequency synthesizers for digital time division duplexing systems and, more specifically, to a device for reducing a lock-up time of a frequency synthesizer.

2. Description of the Related Art

A digital time division duplexing (hereinafter referred to as digital TDD) system such as a TDD cordless telephone includes a transmitter and receiver. Additionally, a frequency synthesizer is employed in order to generate an intermediate frequency (IF) signal efficiently. However, the lock-up time of the frequency synthesizer, which is the time required by the frequency synthesizer to switch from a transmission frequency to a reception frequency, affects generation of the IF signal. In the digital TDD cordless telephone, the transmitter is disabled in a reception mode, and the receiver is disabled in a transmission mode. In order to generate appropriate frequencies for the respective operational modes, the digital TDD cordless telephone has a signal processor consisting of a phase controlled oscillator. The phase controlled oscillator is switched at high speed for a guard time when the transmitter and the receiver are respectively disabled and enabled.

FIG. 1 is a block diagram of a conventional signal processor for a digital cordless telephone. The signal processor is divided into a transmitter, a receiver, and a frequency synthesizer 100. The receiver is composed of a low noise amplifier (LNA) 4, a first mixer 5, a bandpass filter (BPF) 6, an amplifier 7, a second mixer 8, a second bandpass filter 9, a second amplifier 10, a first local oscillator 24, and a demodulator (not shown). The transmitter is composed of a local oscillating circuit 200 (consisting, itself, of a local oscillator 21, a frequency multiplier 22, and a bandpass filter 23), a third mixer 13, and two power amplifiers 14 and 15. The frequency synthesizer 100 is connected between the first and third mixers 5 and 13 by way of buffers 11 and 12, respectively. Additionally, the signal processor includes an antenna 1, a bandpass filter 2, a switch 3, and a baseband filter (BBF) 20 for providing the frequency synthesizer 100 with digital data output from a central processing unit (not shown).

As illustrated, the signal processor has two separate local oscillators 21 and 24 generating the local oscillation frequencies for transmission and reception, respectively.

In the reception mode, a handset receives a radio signal transmitted from a base set (or base unit) through antenna 1, and delivers the received radio signal to the receiver by way of bandpass filter 2 and switch 3. In the transmission mode, the handset transfers a transmission frequency output from the transmitter to antenna 1 via switch 3 and the bandpass filter 2.

In FIG. 1, an intermediate frequency f(IF) is identical to the local oscillation frequency f(LO) for transmission. Accordingly, in the reception mode, the local oscillation frequency f(LO) output from the transmitter affects the intermediate frequency f(IF) output from the first mixer 5 of the receiver, thereby lowering the receiving sensitivity. In order to prevent such a phenomenon, the local oscillating circuit 200 should be disabled during the reception mode. However, second local oscillator 21 of local oscillating circuit 200, which is a crystal oscillator with high stability, has a very low switching speed and thus, cannot interlock with the other elements in the transmitter. Therefore, instead of disabling second local oscillator 21 to prevent the local oscillation frequency f(LO) from affecting the intermediate frequency f(IF), local oscillating circuit 200 includes a frequency multiplier 22 and a bandpass filter 23, whereby the frequency multiplier 22 is disabled in the reception mode.

However, since the second local oscillator 21 continues to oscillate even in the reception mode, harmonic distortion signals are generated corresponding to the exponential frequency characteristic of semiconductor elements (e.g., transistors and diodes), which may be difficult to remove. Further, local oscillating circuit 200 requires LC bandpass filter 23, which consists of an inductor (L) and a capacitor (C) to filter unwanted harmonic frequencies generated from frequency multiplier 22. The inductor of bandpass filter 23 is relatively large in size and expensive, compared to the other elements. Additionally, the signal processor includes two separate local oscillators 24 and 21 for the receiver and the transmitter, respectively, which make the processor undesirably expensive and heavy.

FIG. 2 shows a block diagram of an improved conventional signal processor in the digital cordless telephone. The signal processor is an improvement over the processor of FIG. 1 in that it employs fast frequency switching to switch from a transmission frequency to a reception frequency. However, as stated hereinbelow, the signal processor of FIG. 2 is not without deficiency. For example, the lock-up time of the frequency synthesizer cannot be reduced to below 20 μsec. The improved signal processor includes baseband filter 20, a frequency synthesizer 300, and a switch 28. The baseband filter 20 has an output terminal connected to frequency synthesizer 300. An output terminal of frequency synthesizer 300 is connected to second mixer 8 and third mixer 13 via switch 28, which is switchable according to the desired operating mode. The other structures are the same as those of the processor of FIG. 1.

FIG. 3 is a block diagram of the conventional frequency synthesizer 300 of FIG. 2. The frequency synthesizer 300 includes a PLL IC (Phase Locked Loop Integrated Circuit) 25, a voltage controlled oscillator 26, and a loop filter 27. The PLL IC 25 is composed of the following elements: a first frequency divider 25a for frequency dividing an output frequency f0 of a reference frequency generator 16 by a divisor R; a phase comparator 25b for comparing an output frequency f1 of first frequency divider 25a with a frequency f2 to detect a phase difference therebetween; a charge pump 25c for controlling the charging and discharging of a capacitor in loop filter 27 in response to an output of phase comparator 25b; a pre-scaler 25e for frequency dividing an output frequency of voltage controlled oscillator 26 by a divisor P/(P+1); and a second frequency divider 25d for frequency dividing an output frequency of pre-scaler 30 by a divisor N to generate the frequency f2 to phase comparator 25b. The loop filter 27, which is connected between voltage controlled oscillator 26 and an output terminal Do of charge pump 25c, shapes the output signal of the charge pump 25c. A channel selection signal Rx/Tx is applied to a divide ratio switching input terminal DIV of PLL IC 25. The channel selection signal Rx/Tx sets the transmission and reception modes, and is provided from the central processing unit.

Referring back to FIG. 2, an output terminal of reference frequency generator 16 is connected to an input terminal of PLL IC 25 in frequency synthesizer 300. The switches 3 and 28 are interlocked with each other, and are switchable according to the channel selection (or mode selection) signal Rx/Tx. Specifically, in the reception mode, movable contacts 'a' of switches 3 and 28 are switched to fixed contacts 'b', which are connected to the receiver. Further, in the transmission mode, the movable contacts 'a' are switched to fixed contacts 'c', which are connected to the transmitter. Accordingly, in the reception mode, an RF (Radio Frequency) signal captured by antenna 1 is delivered to low noise amplifier 4 through bandpass filter 2, and in the transmission mode, a transmission signal output from power amplifier 15 is transmitted through antenna 1. An output of frequency synthesizer 100 is amplified by buffers 11 and 12 and transferred to first and third mixers 5 and 13, respectively. In the receiver, an input frequency f(Rx) is amplified by low noise amplifier 4 and then mixed by first mixer 5 with a reference frequency f(R) provided from buffer 11. As a result, an output signal is generated from first mixer 5 which includes a first intermediate frequency f(IF1). The bandpass filter 6 passes the first intermediate frequency signal f(IF1), which is a difference frequency between the reference frequency f(R) and the input frequency f(Rx). The output of bandpass filter 6 is amplified by amplifier 7 and applied to second mixer 8. The second mixer 8 generates a second intermediate frequency f(IF2), by mixing the output of first amplifier 7 with an output of frequency synthesizer 300. In this manner, it is possible to reduce the settling time of voltage controlled oscillator 26 of frequency synthesizer 300. Here, the term settling time refers to the time required for a signal to reach a steady state after an overshoot of less than ±10%. Since the lock-up time of a frequency synthesizer is the sum of the settling time and the transition time of the voltage controlled oscillator in the synthesizer, as further explained hereinbelow with reference to FIG. 5, reducing the settling time directly reduces the lock-up time.

In spite of the improvement, the signal processor of FIG. 2 still cannot reduce the lock-up time of frequency synthesizer 300 to below 20 $\mu$sec. The divisors R, N, and P/(P+1) are properly adjustable according to the guard time of the digital TDD cordless telephone in order to realize the fast frequency switching. However, the harmonic distortion signals are generated so that it may be difficult to distinguish the local oscillation frequency f(V) being applied to third mixer 13 in the transmission mode from the intermediate frequency f(IF1) being applied to second mixer 8 in the reception mode. Thus, frequency synthesizer 300 is unsuitable as the signal source. Further, since frequency synthesizer 300 communicates with a central processing unit (CPU) at a TDD data transfer rate, the CPU may be overloaded. In other words, the fast frequency switching needs the high data transfer rate of the CPU, which causes overload on the CPU.

FIG. 4 shows a waveform of the transmission/reception channel selection signal Rx/Tx. The cordless telephone is switched to the reception mode from the transmission mode when the channel selection signal Rx/Tx makes a transition from a high state to a low state. In this case, frequency synthesizer 300 switches its output frequency to the reception frequency in response to the channel selection signal Rx/Tx. At this moment, as show in FIG. 5, the frequency output from voltage controlled oscillator 26 reaches a steady state after the passage of a transition (or rising) time [required when the frequency f(IF1) is switched to a frequency f(IF3)] and a settling time. The sum of the transition and the settling time is the lock-up time. The frequency output is maintained in the steady state until the operating mode is again changed.

FIG. 6 shows an output waveform of charge pump 25c in PLL IC 25. As illustrated, the output voltage of charge pump 25c drops from a first voltage V1 to a second voltage V2 when the operating mode is changed to the reception mode, thereby switching the frequencies from f(IF1) to f(IF3). Specifically, when frequency synthesizer 300 generates the transmission frequency in the transmission mode, the reference divider output frequency f1 is identical to the programmable divider output frequency f2, so that the charge pump 25c generates the first voltage V1. In the meantime, if the operating mode is changed to the reception mode, frequency synthesizer 300 should ideally switch the transmission frequency to the reception frequency instantaneously. In practice, however, frequency synthesizer 300 needs a lock-up time to switch the transmission frequency to the reception frequency. During this lock-up time, the reference divider output frequency f1 does not coincide with the programmable divider output frequency f2, so that charge pump 25c generates the second voltage V2 in response to the phase detection signal output from phase comparator 25b. In order to reduce the lock-up time, it is necessary to minimize the transition time and reduce an amplitude of the overshoot.

SUMMARY OF THE INVENTION

It is therefore an object of the present invention to provide a device for reducing a lock-up time of a frequency synthesizer during frequency switching.

To achieve the above and other objects, there is provided a device for reducing a lock-up time in a digital cordless telephone. The telephone includes a first frequency synthesizer for generating a reference frequency, a receiver having a first mixer for mixing the reference frequency with an input frequency to generate a first intermediate frequency and a second mixer to generate a second intermediate frequency, and a transmitter having a third mixer to generate a transmission frequency. The device includes: a band switching controller for receiving an inverse channel selection signal; and a second frequency synthesizer for generating third and fourth intermediate frequencies to the second and third mixers, respectively, according to a channel selection signal for setting transmission and reception modes. The second frequency synthesizer includes: a voltage controlled oscillator for generating a frequency according to a charge pump voltage applied at an input of the oscillator; a loop filter for shaping the charge pump voltage being applied to the input of the voltage controlled oscillator; and a phase locked loop for comparing the reference frequency with a frequency output from the voltage controlled oscillator to generate a voltage according to a phase difference therebetween to the input of the voltage controlled oscillator via the loop filter. The band switching controller maintains an input voltage of the voltage controlled oscillator upon receiving the inverse channel selection signal.

These and other objects, features and advantages of the present invention will become apparent from the following detailed description of illustrative embodiments thereof, which is to be read in connection with the accompanying drawings, where the same reference numerals are used to represent the same .functional-elements.

DETAILED DESCRIPTION OF PREFERRED EMBODIMENTS

Figure 1:
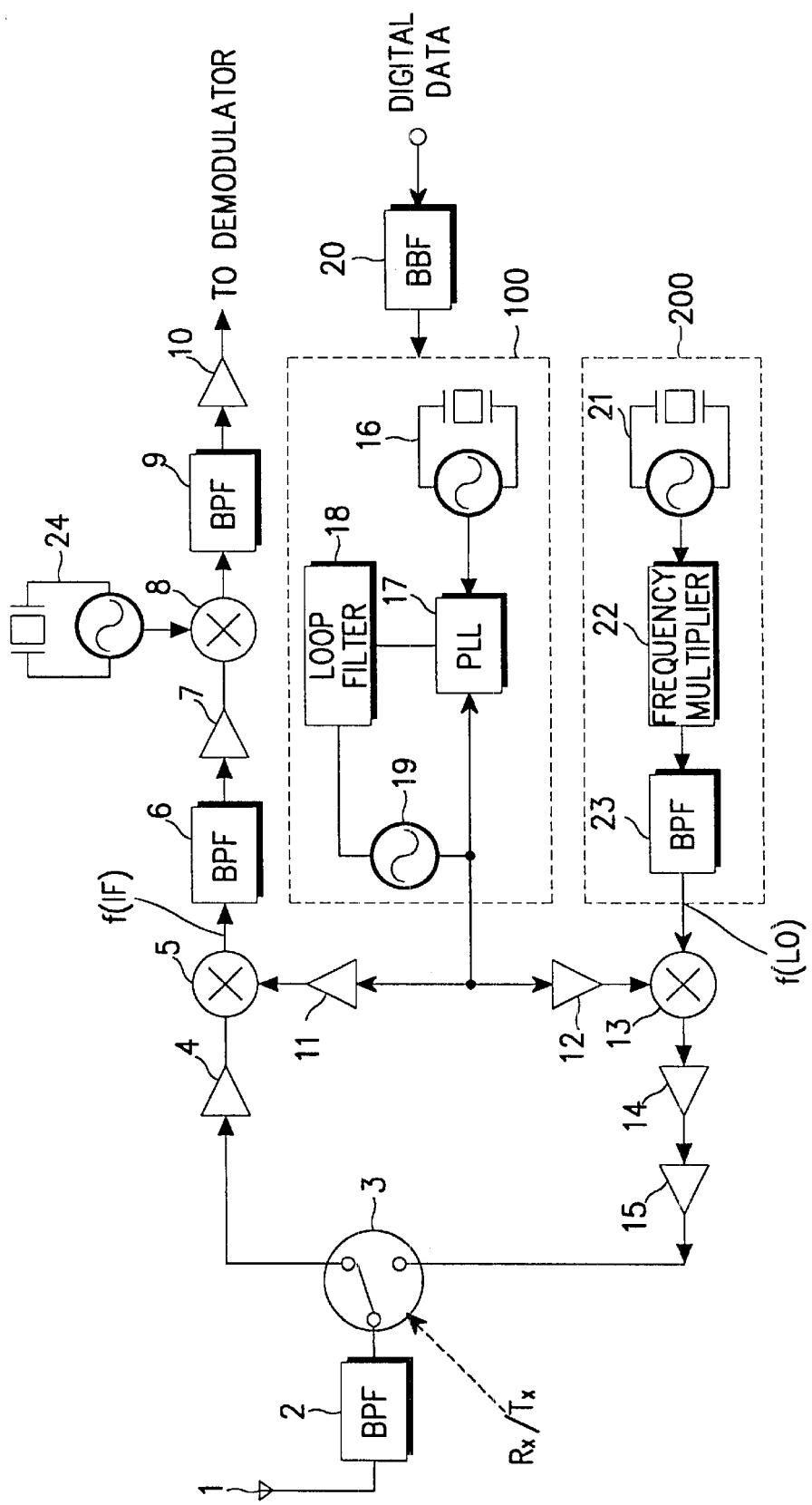
FIG. 1 is a block diagram of a conventional signal processor for a digital cordless telephone.
Figure 2:
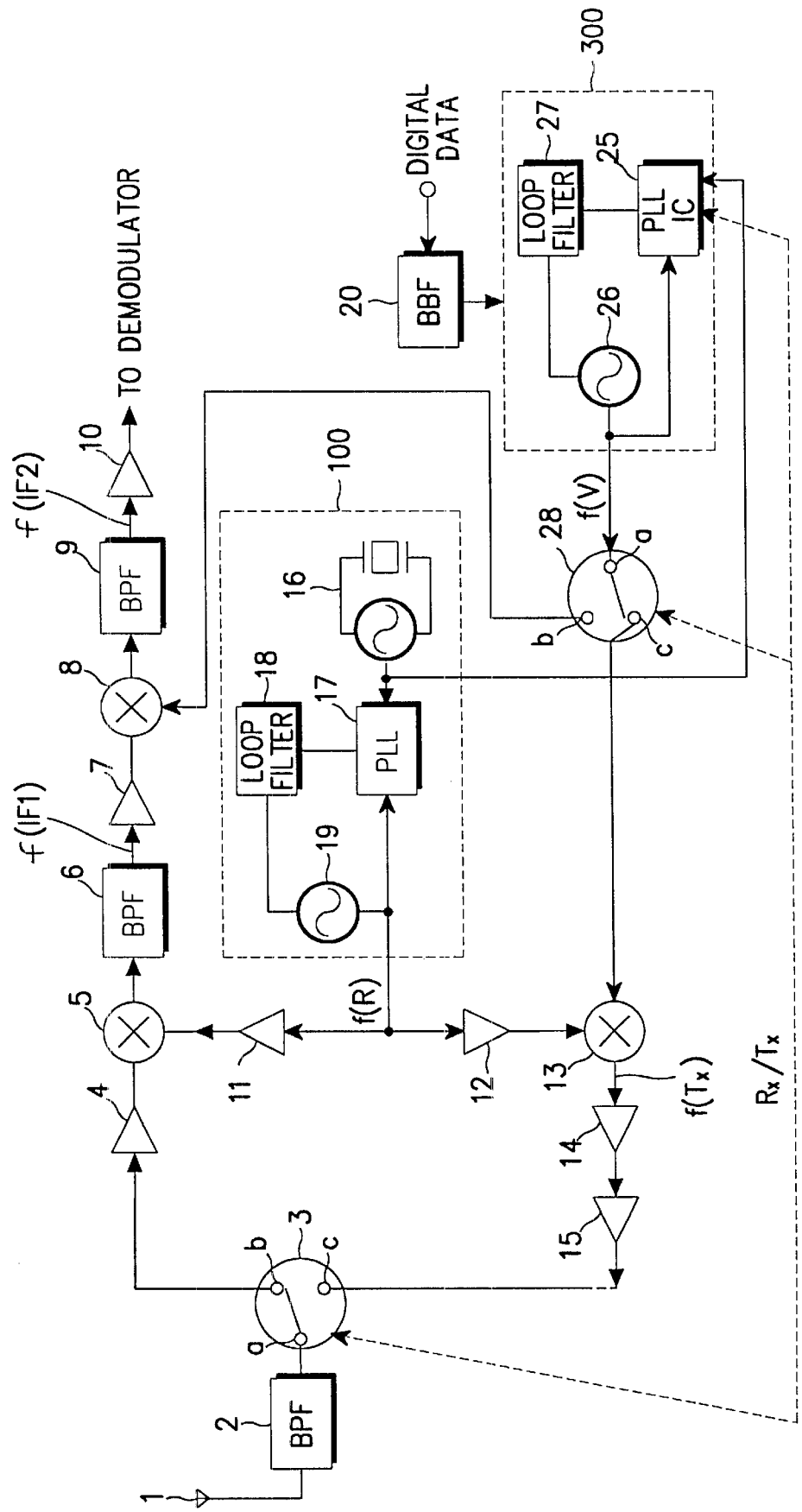
FIG. 2 is a block diagram of another conventional signal processor for a digital cordless telephone.

A preferred embodiment of the present invention will be described in detail hereinbelow with reference to the accompanying drawings, in which like reference numerals denote the same elements. In the following description, numerous specific details are set forth to provide a more thorough understanding of the present invention. It will be apparent, however, to one skilled in the art that the present invention may be practiced without these specific details. In other instances, well known functions or constructions have not been described so as not to obscure the present invention.

Figure 3:
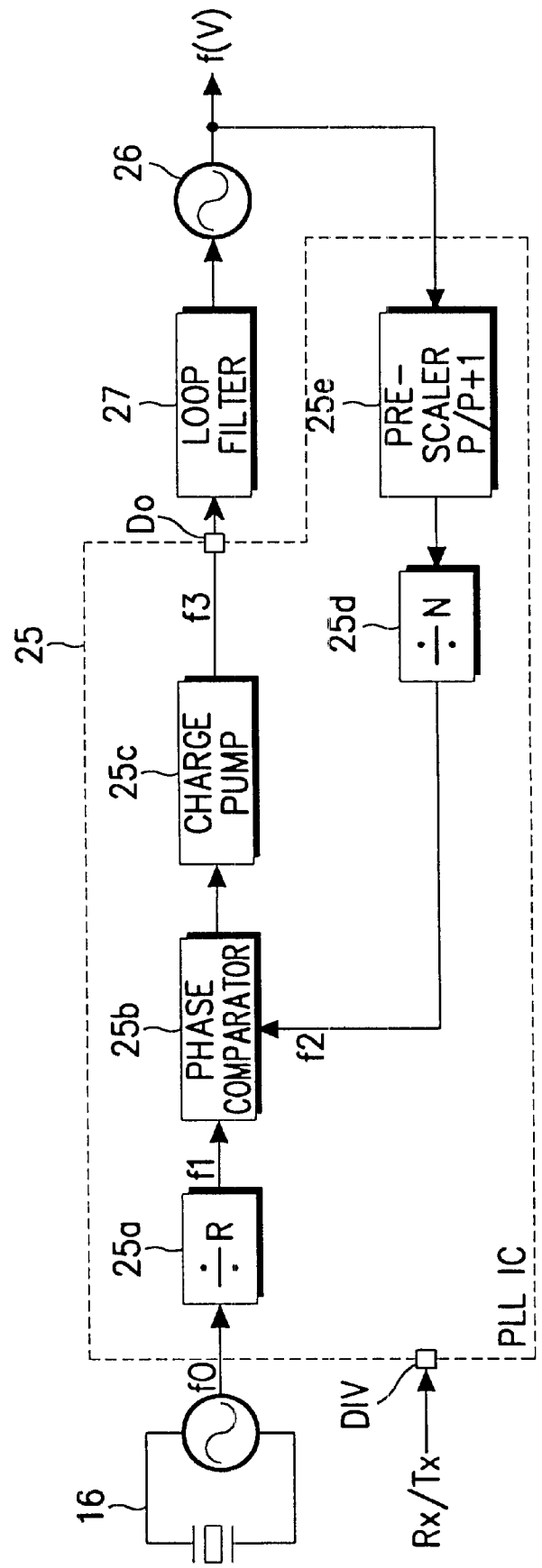
FIG. 3 is a detailed block diagram of a frequency synthesizer of FIG. 2.
Figure 4:
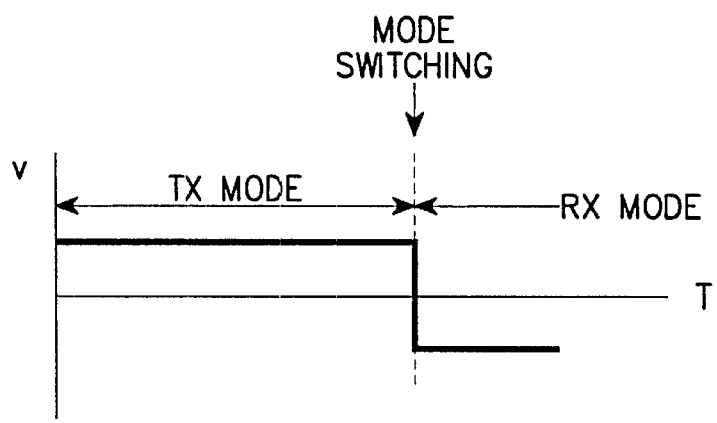
FIG. 4 is a diagram illustrating a waveform of a channel selection signal.
Figure 7:
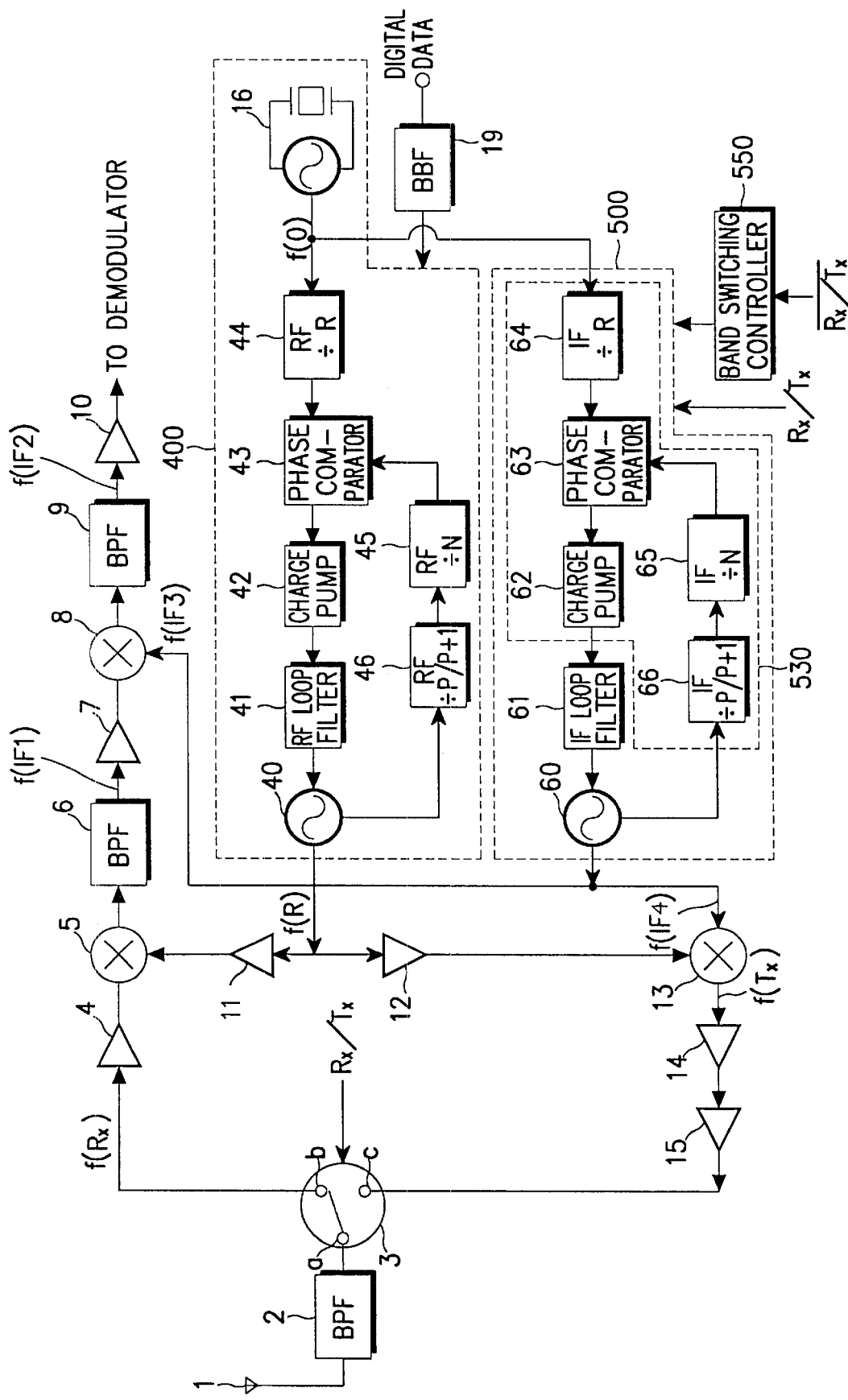
FIG. 7 is a block diagram of a signal processor for a digital cordless telephone according to embodiment of the present invention.

FIG. 7 illustrates a signal processor for a digital cordless telephone according to an embodiment of the present invention. Portions of the processor of FIG. 7 have some structural similarities to the processor shown in FIG. 1. However, frequency synthesizer 100 and local oscillating circuit of FIG. 1 have been replaced by first and second frequency synthesizers 400 and 500, respectively, and a band switching controller 550 has been added. Further, first and second frequency synthesizers 400 and 500 are similar to the frequency synthesizer shown in FIG. 3. However, the radio frequency processed by first frequency synthesizer 400 is relatively higher than the intermediate frequency processed by second frequency synthesizer 500. The band switching controller 550 is used to control second frequency synthesizer 500 to accelerate frequency (band) switching. In response to the channel selection signal Rx/Tx and the inverse channel selection signal $\overline{Rx/Tx}$ input from band switching controller 550, second frequency synthesizer 500 generates a third IF signal f(IF3) in the reception mode and a fourth IF signal f(IF4) in the transmission mode. The third and fourth IF signals f(IF3) and f(IF4) are applied to the second and third mixers 8 and 13, respectively.

As to the construction of the second frequency synthesizer 500, a frequency divider 64 frequency divides the reference frequency f0 output from the reference frequency generator 16 by a divisor R, and a second voltage controlled oscillator 60 runs at a given frequency and is locked up in response to a control voltage input. Further, a frequency divider 65 frequency divides the feedback frequency output from the second voltage controlled oscillator 60 by a divisor N, and a phase comparator 63 compares an output frequency of frequency divider 65 with an output frequency of frequency divider 64 to detect a phase difference therebetween. A charge pump 62 generates an output voltage proportional to the phase difference detected. An IF loop filter 61 shapes an output voltage of charge pump 62.

Figure 8:
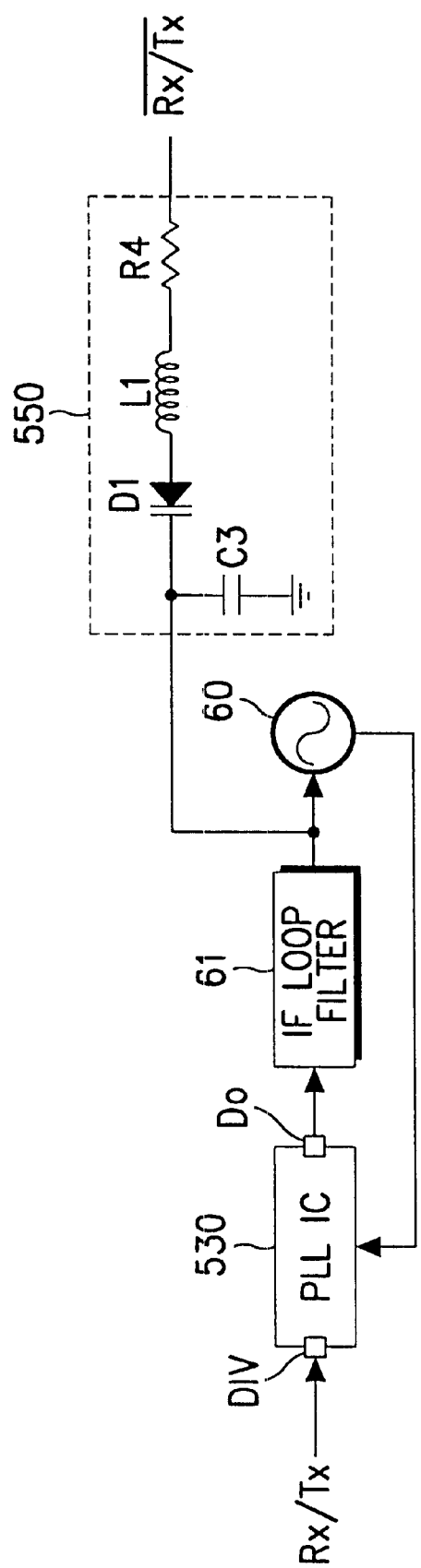
FIG. 8 is a detailed circuit diagram of a second frequency synthesizer and a band switching controller of FIG. 7.

FIG. 8 shows a detailed circuit diagram of the second frequency synthesizer 500 and the band switching controller 550 of FIG. 7. Referring to FIG. 8, a PLL IC 530, which is composed of phase comparator 63, charge pump 62, frequency dividers 64 and 65, and a pre-scaler 66, receives the channel selection signal Rx/Tx at a divide ratio switching input terminal DIV. The channel selection signal Rx/Tx for setting the transmission and reception modes is provided from a central processing unit. The PLL IC 530 may be, for example, a MB15S02 manufactured by Fujitsu Co. of Japan. The band switching controller 550 is comprised of a varactor diode D1, a capacitor C3, an inductor L1, and a resistor R4. The inverse channel selection signal $\overline{Rx/Tx}$ is applied to second voltage controlled oscillator 60 via resistor R4, inductor L1, and varactor diode D1. The voltage controlled oscillator 60 has an input terminal connected in common with a cathode of the varactor diode D1 and a charge pump voltage output terminal Do of PLL IC 530 via IF loop filter 61. The capacitor C3 is connected between the cathode and a ground. However, at the designer's option, band switching controller 550 may be replaced by a transistor.

Figure 5:
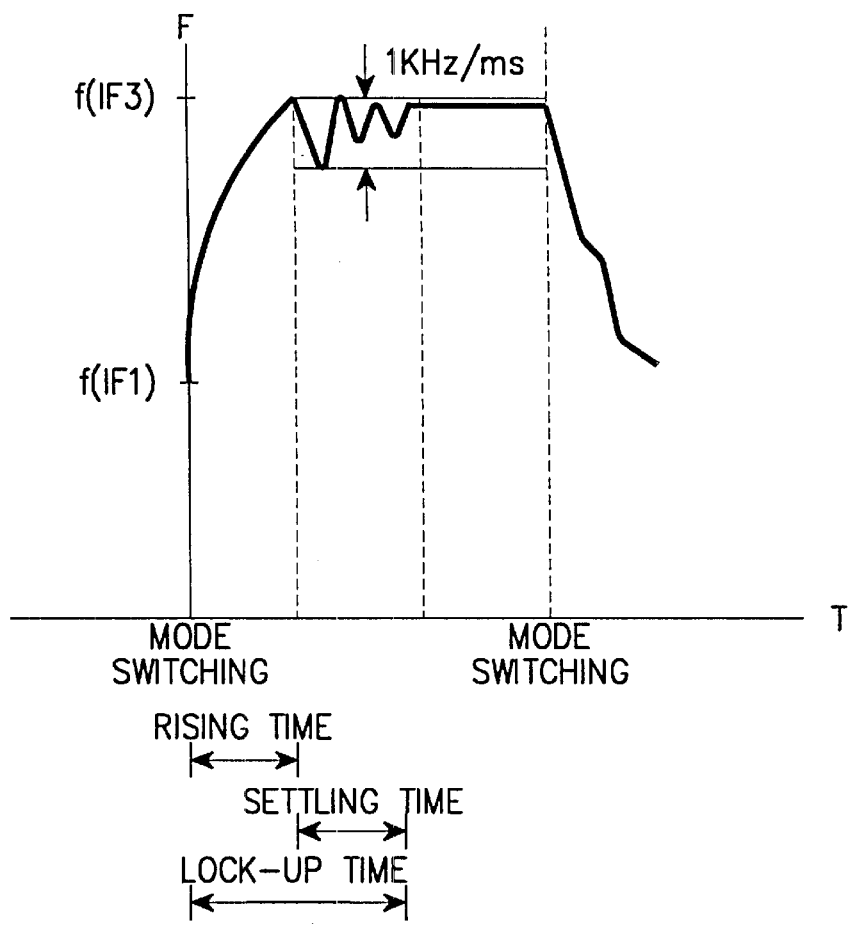
FIG. 5 is a diagram illustrating an output frequency of a voltage controlled oscillator of FIG. 3.
Figure 6:
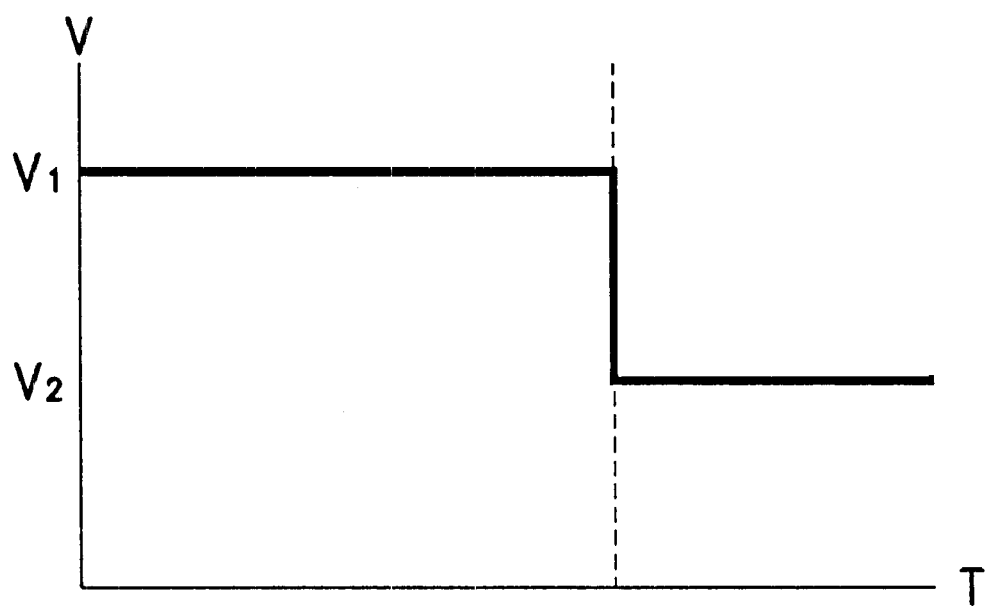
FIG. 6 is a digram illustrating an output waveform of a charge pump of FIG. 3.
Figure 9:
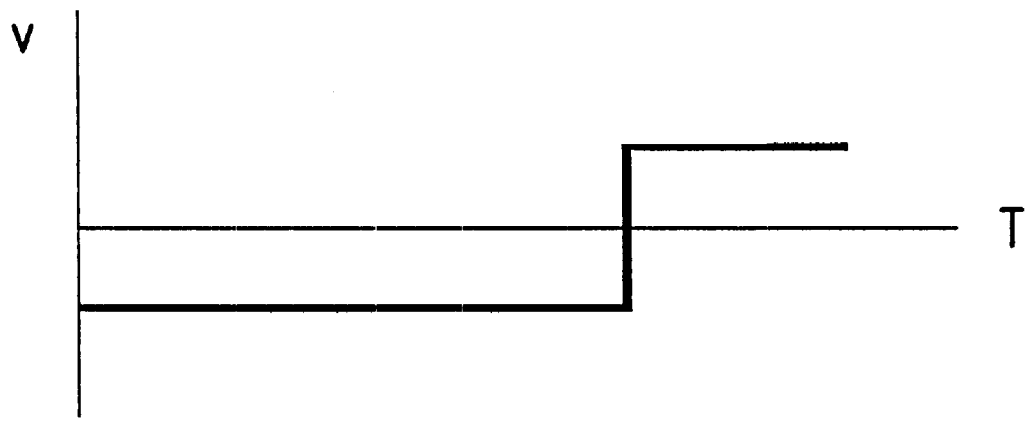
FIG. 9 is a diagram illustrating a waveform of an inverse channel control signal.
Figure 10:
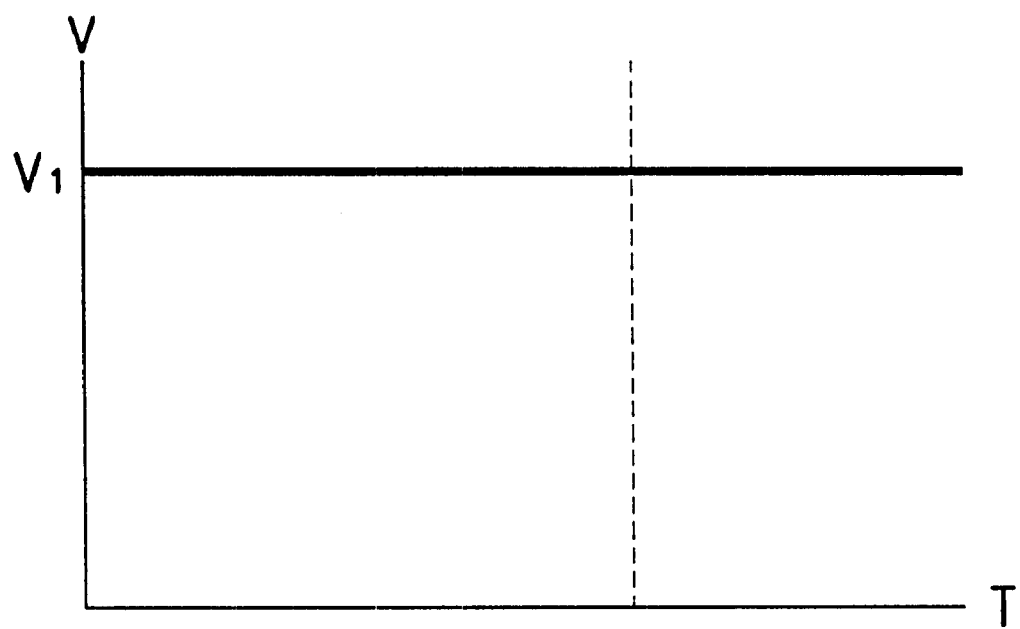
FIG. 10 is a diagram illustrating an output waveform of a charge pump of FIG. 8.

In operation, if the channel selection signal Rx/Tx is changed from a high state to a low state to switch the operating mode of the signal processor to the reception mode, band switching controller 550 will be provided with the high state of the inverse channel selection signal $\overline{Rx/Tx}$, as shown in FIG. 9. The abrupt transition of the inverse channel selection signal $\overline{Rx/Tx}$ will cause a voltage difference between the cathode and the anode of varactor diode D1, and turn on varactor diode D1. Preferably, the voltage difference is maintained for a time period equal to the transition time shown in FIG. 5, by adjusting capacitor C3 and resistor R4. As varactor diode D1 is turned on, the high state voltage of the inverse channel selection signal $\overline{Rx/Tx}$ is applied to voltage controlled oscillator 60, so that the input voltage of the voltage controlled oscillator 60 may be maintained in the substantially constant value, as shown in FIG. 10. As a result, the transition time is reduced. In this manner, the lock-up time of frequency synthesizer 500 can be reduced to below 20 μsec.

As described above, band switching controller 550 maintains the constant voltage input to voltage controlled oscillator 60 irrespective of a change in the operating mode of the signal processor, thereby reducing the lock-up time.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A device for reducing a lock-up time in a time division duplexing system, the system having a first frequency synthesizer for generating a reference frequency, a receiver having a first mixer for mixing the reference frequency with an input frequency to generate a first intermediate frequency and a second mixer to generate a second intermediate frequency, and a transmitter having a third mixer to generate a transmission frequency, the device comprising:

a band switching controller for receiving an inverse channel selection signal and generating a corresponding band switching controller voltage; and a second frequency synthesizer for generating third and fourth intermediate frequencies to the second and third mixers, respectively, according to a channel selection signal for setting transmission and reception modes, said second frequency synthesizer including:

a voltage controlled oscillator for generating a frequency according to either of a charge pump voltage or the band switching controller voltage applied at an input of the oscillator;

a loop filter for shaping the charge pump voltage being applied to the input of the voltage controlled oscillator; and a phase locked loop for comparing the reference frequency with a frequency output from the voltage controlled oscillator to generate a voltage according to a phase difference therebetween to the input of the voltage controlled oscillator via the loop filter, wherein the band switching controller voltage maintains an input voltage level of the voltage controlled oscillator upon receiving the inverse channel selection signal when switching from the transmitting to the reception mode.

2. The device of claim 1, wherein said band switching controller comprises a varactor diode having a cathode connected to the input of the voltage controlled oscillator and an anode connected to the inverse channel selection signal.

3. The device of claim 2, wherein said band switching controller further comprises:

a capacitor connected between the cathode of the varactor diode and a ground voltage;

an inductor connected to the anode of the varactor diode; and a resistor connected between the inductor and the inverse channel selection signal.

4. The device of claim 1, wherein said band switching controller comprises a transistor.

5. The device of claim 1, wherein said phase locked loop comprises:

a first frequency divider for frequency dividing the reference frequency by a first divisor;

a second frequency divider for frequency dividing a feedback frequency output from the voltage controlled oscillator by a second divisor;

a phase comparator for comparing an output frequency of the first frequency divider with an output frequency of the second frequency divider, to detect a phase difference therebetween; and a charge pump for generating the charge pump voltage, the charge pump voltage being generated in proportion to the phase difference detected by the phase comparator.

6. The device of claim 5, wherein said second frequency synthesizer further comprises a pre-scaler interposed between the voltage controlled oscillator and the second frequency divider.

7. The device of claim 1, wherein said band switching controller comprises:

a varactor diode having a cathode connected to the voltage controlled oscillator and an anode connected to the inverse channel selection signal; and a capacitor connected between the cathode of the varactor diode and a ground voltage, the capacitor for setting a DC bias of the varactor diode.

8. The device of claim 7, wherein said band switching controller further comprises:

an inductor connected to the anode of the varactor diode; and a resistor connected between the inductor and the inverse channel selection signal.

9. The device of claim 5, wherein said band switching controller comprises a transistor.

10. The device of claim 1, wherein the second mixer mixes the third intermediate frequency with the first intermediate frequency to generate the second intermediate frequency, and the third mixer mixes the fourth intermediate frequency with the reference frequency to generate the transmission frequency.

11. A device for reducing a lock-up time in a digital cordless telephone, the telephone having a first frequency synthesizer for generating a reference frequency, a receiver having a first mixer for mixing the reference frequency with an input frequency to generate a first intermediate frequency and a second mixer to generate a second intermediate frequency, and a transmitter having a third mixer to generate a transmission frequency, the device comprising:

a band switching controller for receiving an inverse channel selection signal and generating a corresponding band switching controller voltage; and a second frequency synthesizer for generating third and fourth intermediate frequencies to the second and third mixers, respectively, according to a channel selection signal for setting transmission and reception modes, said second frequency synthesizer including:

a voltage controlled oscillator for generating a frequency according to either of a charge pump voltage or the band switching controller voltage applied at an input of the oscillator;

a loop filter for shaping the charge pump voltage being applied to the input of the voltage controlled oscillator; and a phase locked loop for comparing the reference frequency with a frequency output from the voltage controlled oscillator to generate a voltage according to a phase difference therebetween to the input of the voltage controlled oscillator via the loop filter, wherein the band switching controller voltage maintains an input voltage level of the voltage controlled oscillator upon receiving the inverse channel selection signal when switching from the transmitting to the reception mode.

12. The device of claim 11, wherein said band switching controller comprises a varactor diode having a cathode connected to the input of the voltage controlled oscillator and an anode connected to the inverse channel-selection signal.

13. The device of claim 12, wherein said band switching controller further comprises:

a capacitor connected between the cathode of the varactor diode and a ground voltage;

an inductor connected to the anode of the varactor diode; and a resistor connected between the inductor and the inverse channel selection signal.

14. The device of claim 11, wherein said band switching controller comprises a transistor.

15. The device of claim 11, wherein said phase locked loop comprises:

a first frequency divider for frequency dividing the reference frequency by a first divisor;

a second frequency divider for frequency dividing a feedback frequency output from the voltage controlled oscillator by a second divisor;

a phase comparator for comparing an output frequency of the first frequency divider with an output frequency of the second frequency divider, to detect a phase difference therebetween; and a charge pump for generating the charge pump voltage, the charge pump voltage being generated in proportion to the phase difference detected by the phase comparator.

16. The device of claim 15, wherein said second frequency synthesizer further comprises a pre-scaler interposed between the voltage controlled oscillator and the second frequency divider.

17. The device of claim 11, wherein said band switching controller comprises:
- a varactor diode having a cathode connected to the voltage controlled oscillator and an anode connected to the inverse channel selection signal; and
- a capacitor connected between the cathode of the varactor diode and a ground voltage, the capacitor for setting a DC bias of the varactor diode.

18. The device of claim 17, wherein said band switching controller further comprises:
- an inductor connected to the anode of the varactor diode; and
- a resistor connected between the inductor and the inverse channel selection signal.

19. The device of claim 15, wherein said band switching controller comprises a transistor.

20. The device of claim 11, wherein the second mixer mixes the third intermediate frequency with the first intermediate frequency to generate the second intermediate frequency, and the third mixer mixes the fourth intermediate frequency with the reference frequency to generate the transmission frequency.

* * * * *